US011586572B2

(12) United States Patent
Yang et al.

(10) Patent No.: US 11,586,572 B2
(45) Date of Patent: Feb. 21, 2023

(54) FIELD PROGRAMMABLE GATE ARRAY AND COMMUNICATION METHOD

(71) Applicant: Huawei Technologies Co., Ltd., Guangdong (CN)

(72) Inventors: Weiguo Yang, Shenzhen (CN); Jun Tu, Shenzhen (CN); Zuo Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 462 days.

(21) Appl. No.: 15/282,561

(22) Filed: Sep. 30, 2016

(65) Prior Publication Data

US 2017/0024349 A1 Jan. 26, 2017

Related U.S. Application Data

(63) Continuation of application No. PCT/CN2014/074732, filed on Apr. 3, 2014.

(51) Int. Cl.
*G06F 13/40* (2006.01)
*H03K 19/17736* (2020.01)
(Continued)

(52) U.S. Cl.
CPC ...... *G06F 13/4027* (2013.01); *G06F 13/4022* (2013.01); *H03K 19/1774* (2013.01); *H03K 19/17728* (2013.01); *H03K 19/17792* (2013.01)

(58) Field of Classification Search
CPC .................................................. G06F 17/5054
See application file for complete search history.

(56) References Cited

U.S. PATENT DOCUMENTS 5,488,317 A * 1/1996 Webster ......... H03K 19/018585
326/114
5,682,107 A * 10/1997 Tavana ............. H03K 19/17704
326/39
(Continued)

FOREIGN PATENT DOCUMENTS

CN 101802800 A 8/2010
CN 102799549 A 11/2012
(Continued)

OTHER PUBLICATIONS

Dan, Y., et al., "From ASIC to FPGA Conversion System Clock Design," vol. 10, No. 7, Jul. 2008, 8 pages.
(Continued)

*Primary Examiner* — Henry Tsai
*Assistant Examiner* — Juanito C Borromeo
(74) *Attorney, Agent, or Firm* — Slater Matsil, LLP

(57) ABSTRACT

The application provides a field programmable gate array (FPGA) and a communication method. At least one application specific integrated circuit based (ASIC-based) hard core is embedded in the FPGA. The ASIC-based hard core includes a high-speed exchange and interconnection unit and at least one station. Each station is connected to the high-speed exchange and interconnection unit. The station is configured to transmit data between each functional module in the FPGA and the ASIC-based hard core. The high-speed exchange and interconnection unit is configured to transmit data between the stations. In the FPGA provided by the application, an ASIC-based hard core is embedded, which can facilitate data exchange between each functional module and the ASIC-based hard core in proximity and reduce a time delay.

17 Claims, 13 Drawing Sheets

(51) Int. Cl.
H03K 19/17728 (2020.01)
H03K 19/17792 (2020.01)

(56) References Cited

U.S. PATENT DOCUMENTS

| | | | |
|---|---|---|---|
| 6,286,093 | B1 | 9/2001 | Chang et al. |
| 7,734,968 | B2 * | 6/2010 | Grupp ............ G01R 31/318541 |
| | | | 714/724 |
| 8,583,844 | B2 * | 11/2013 | Pullagoundapatti ........................ |
| | | | G06F 15/17312 |
| | | | 710/110 |
| 9,142,002 | B2 * | 9/2015 | Dutton ....................... G06T 1/20 |
| 2005/0021896 | A1 | 1/2005 | Kim et al. |
| 2005/0097305 | A1 | 5/2005 | Doering et al. |
| 2005/0177664 | A1 | 8/2005 | Cho et al. |
| 2005/0256969 | A1 | 11/2005 | Yancey et al. |
| 2007/0074140 | A1 * | 3/2007 | Yancey ............... G06F 13/4256 |
| | | | 710/312 |
| 2007/0101242 | A1 | 5/2007 | Yancey et al. |
| 2009/0073967 | A1 | 3/2009 | How et al. |
| 2010/0308862 | A1 | 12/2010 | Kelem et al. |
| 2012/0054484 | A1 | 3/2012 | Matsumoto |
| 2012/0146685 | A1 | 6/2012 | Kelem et al. |
| 2013/0297043 | A1 | 11/2013 | Choi et al. |
| 2014/0115360 | A1 * | 4/2014 | Zhou ....................... G06F 1/266 |
| | | | 713/320 |
| 2014/0145758 | A1 * | 5/2014 | Atsatt ................ H03K 19/1731 |
| | | | 326/41 |

FOREIGN PATENT DOCUMENTS

| | | |
|---|---|---|
| CN | 103439648 A | 12/2013 |
| JP | 2004133942 A | 4/2004 |
| JP | 2005228311 A | 8/2005 |
| JP | 2007199859 A | 8/2007 |
| JP | 2009542098 A | 11/2009 |
| JP | 2010124439 A | 6/2010 |
| JP | 2012049669 A | 3/2012 |
| JP | 2014500644 A | 1/2014 |
| WO | 2009145608 A1 | 12/2009 |
| WO | 2010079326 A2 | 7/2010 |
| WO | 2011155622 A1 | 12/2011 |

OTHER PUBLICATIONS

Zhou, L., et al., "Design of 1553B IP Core Based on ASIC Technology," Chinese Journal of Space Science, vol. 34, No. 1, Jan. 2014, 13 pages.

* cited by examiner

FIELD PROGRAMMABLE GATE ARRAY AND COMMUNICATION METHOD

CROSS-REFERENCE TO RELATED APPLICATIONS

This application is a continuation of International Application No. PCT/CN2014/074732, filed on Apr. 3, 2014, the disclosure of which is hereby incorporated by reference in its entirety.

TECHNICAL FIELD

The application relates to the field of integrated circuit technologies, and in particular, to a field programmable gate array and a communication method.

BACKGROUND

A field programmable gate array (FPGA) is a product further developed based on a programmable device such as a programmable logic array (PLA), a gate array logic (GAL), or a complex programmable logic device (CPLD). The FPGA emerges as a semi-customized circuit in the application specific integrated circuit (ASIC) field. The FPGA not only remedies deficiencies of customized circuits, but also overcomes a disadvantage that a quantity of gate circuits in an original programmable device is limited. The FPGA is a main hardware platform in a current digital system design. A main feature of the FPGA is that the FPGA is completely configured and programmed by a user by using software, so as to implement a particular function, and the FPGA can be erased repeatedly. Therefore, the FPGA is applied increasingly widely.

Currently, a structure of an FPGA chip is mainly based on a lookup table (LUT) technology, and includes a hard core (ASIC type) integrating common functional modules (for example, RAM, clock management, and DSP).

Because the LUT-based FPGA has very high integration, and density of the FPGA includes tens of thousands or even tens of millions of gates, the FPGA can implement a circuit function having an extremely complex time sequence and logic combination. Main components of the FPGA include a programmable input/output unit, a basic programmable logic unit, complete clock management, an embedded block RAM, rich routing resources, an embedded underlying functional unit, and an embedded dedicated hardware module.

Referring to FIG. 1, FIG. 1 is a schematic diagram of an application of an FPGA in the prior art.

A scale of the FPGA has reached a mega-level, including (K*K) logic elements (LE). Functions that can be implemented by the FPGA are also extremely rich and complex. Therefore, during development, the FPGA is divided into many functional modules (Module). Each functional module implements some relatively independent functions, and implements some circuits on the entire chip; however, interfaces need to be used to implement transmission of data and information between functional modules.

For example, in an application instance in FIG. 1, 10 functional modules (functional module 0 to functional module 9) may be used, and there is communication between many functional modules. Using the functional module 0 as an example, there are communication between the functional module 0 and the functional module 1, and communication between the functional module 3 and the functional module 5.

Communication between functional modules needs to be performed by using a defined interface. Because of heavy data traffic, some data bit widths are relatively great. If some functional modules perform communication with multiple functional modules, multiple communications interfaces need to be defined, so that communication is performed with different functional modules by using different communications interfaces.

Each functional module uses an LUT and a flip-flop to implement a circuit function. Interconnection between various circuits is implemented by using routing of the FPGA.

Referring to FIG. 2, FIG. 2 is a schematic diagram of an internal structure of an FPGA in the prior art.

Horizontal lines and vertical lines represent routing resources. Interconnection between inputs and outputs of various configurable logic blocks (CLB) may be implemented by programming. The FPGA in FIG. 2 is connected to the outside by using an input/output block (IOB).

Some CLBs that are distributed in proximity implement a circuit of one functional module together. Some other CLBs in proximity implement a circuit of another functional module together. Communications interfaces and interconnection between functional modules may be implemented by using some CLBs and routing.

Referring to FIG. 3, FIG. 3 is a schematic diagram of mappings of functional modules in an FPGA in the prior art.

The FPGA in FIG. 3 includes three functional modules: a functional module 0, a functional module 3, and a functional module 8.

Each functional module includes multiple CLBs in proximity (small checks in FIG. 3), and the functional modules are connected to each other by using routing (arrows in FIG. 3).

The functional module 0, the functional module 3, and the functional module 8 in FIG. 3 are respectively deployed in upper left, right middle, and lower left positions in the FPGA. An interface is required for interconnection and communication between the functional module 0 and the functional module 3. Likewise, an interface is also required for interconnection and communication between the functional module 3 and the functional module 8.

As can be seen, interconnection and communication between functional modules can be implemented by multi-stage cascading of routing, but multi-stage cascading occupies routing resources and CLE resources of intermediate nodes. Therefore, when many CLBs and routing are passed through, a distance is long, and a long delay is caused. For a 40 nm component, a one-stage jump may need to take 0.7 ns to 1 ns. If the distance is long, a routing delay reaches more than 10 ns. However, logic can hardly run at a frequency higher than 100 MHz. On the other hand, resource utilization is low, and low overall performance is caused. In addition, routing resources of the FPGA are precious and limited. If local routing resources are insufficient, place and routing failure of an entire design is caused, or routing resources in a remote area need to be used.

Therefore, an FPGA that can resolve a problem of a long delay and poor performance of the conventional FPGA needs to be provided.

SUMMARY

To resolve the foregoing technical problem, embodiments of the application provide an FPGA and a communication method, which can resolve a problem of a long delay and poor overall performance of a conventional FPGA.

The following technical solutions are disclosed in the embodiments of the application:

According to a first aspect, a field programmable gate array FPGA is provided, where at least one application specific integrated circuit ASIC-based hard core used for communication and interconnection is embedded in the FPGA;

the ASIC-based hard core includes a high-speed exchange and interconnection unit and at least one station;

each station is connected to the high-speed exchange and interconnection unit;

the station is configured to transmit data between each functional module in the FPGA and the ASIC-based hard core; and the high-speed exchange and interconnection unit is configured to transmit data between the stations.

In a first possible implementation manner of the first aspect, a quantity of the stations is equal to a quantity of functional modules, and one of the stations is connected to one of the functional modules; or each station corresponds to multiple functional modules, and each station is connected to the corresponding multiple functional modules.

With reference to either of the first aspect and the foregoing possible implementation manner, in a second possible implementation manner, when the quantity of the stations is equal to the quantity of the functional modules, a clock frequency, a data bit width, and a time sequence that are consistent with those of a corresponding functional module are configured for each station; and the high-speed exchange and interconnection unit is non-programmable.

With reference to any one of the first aspect and the foregoing possible implementation manners, in a third possible implementation manner, an on-chip interconnect bus protocol of the ASIC-based hard core includes at least one of the following: AVALON, Wishbone, CoreConnect, or AMBA.

With reference to any one of the first aspect and the foregoing possible implementation manners, in a fourth possible implementation manner, the ASIC-based hard core is evenly distributed in the FPGA by using a crossbar switch matrix.

With reference to any one of the first aspect and the foregoing possible implementation manners, in a fifth possible implementation manner, the ASIC-based hard core is a hard core using an AXI-Interconnection bus protocol; the AXI bus protocol belongs to one of the AMBA; and each logic cell bank includes at least one master station and at least one slave station.

With reference to any one of the first aspect and the foregoing possible implementation manners, in a sixth possible implementation manner, the ASIC-based hard core includes two or more than two hard cores using an AXI-Interconnection bus protocol;

the hard cores using the AXI-Interconnection bus protocol communicate with each other by using an AXI bridge; and each logic cell bank includes at least one master station and at least one slave station.

With reference to any one of the first aspect and the foregoing possible implementation manners, in a seventh possible implementation manner, the hard cores using the AXI-Interconnection bus protocol include a same quantity of master stations and a same quantity of slave stations, and have a same bit width and a same frequency.

With reference to any one of the first aspect and the foregoing possible implementation manners, in an eighth possible implementation manner, the hard cores using the AXI-Interconnection bus protocol include different quantities of master stations and different quantities of slave stations, and have different bit widths and different frequencies.

With reference to any one of the first aspect and the foregoing possible implementation manners, in a ninth possible implementation manner, some hard cores using the AXI-Interconnection bus protocol include a same quantity of master stations and a same quantity of slave stations, and have a same bit width and a same frequency; and other hard cores using the AXI-Interconnection bus protocol include different quantities of master stations and different quantities of slave stations, and have different bit widths and different frequencies.

With reference to any one of the first aspect and the foregoing possible implementation manners, in a tenth possible implementation manner, the high-speed exchange and interconnection unit is evenly distributed in the FPGA by using a ring bus.

According to a second aspect, an FPGA-based data communication method is provided, where at least one application specific integrated circuit ASIC-based hard core used for communication and interconnection is embedded in the FPGA; the ASIC-based hard core includes a high-speed exchange and interconnection unit and at least one station; each station is connected to the high-speed exchange and interconnection unit; the station implements data transmission between each functional module in the FPGA and the ASIC-based hard core; the high-speed exchange and interconnection unit implements data transmission between the stations; and the method includes the following steps:

receiving, by the high-speed exchange and interconnection unit by using a station corresponding to a data source functional module, data sent by the data source functional module, where the data carries information about a destination functional module; and sending, by the high-speed exchange and interconnection unit, the received data to the destination functional module according to the information about the destination functional module by using a station corresponding to the destination functional module.

In a first possible implementation manner of the second aspect, a quantity of the stations is equal to a quantity of functional modules, and one of the stations is connected to one of the functional modules; or each station corresponds to multiple functional modules, and each station is connected to the corresponding multiple functional modules.

With reference to either of the second aspect and the foregoing possible implementation manner, in a second possible implementation manner, when the quantity of the stations is equal to the quantity of the functional modules, a clock frequency, a data bit width, and a time sequence that are consistent with those of a corresponding functional module are configured for each station; and the high-speed exchange and interconnection unit is non-programmable.

With reference to any one of the second aspect and the foregoing possible implementation manners, in a third possible implementation manner, an on-chip interconnect bus protocol of the ASIC-based hard core includes at least one of the following: AVALON, Wishbone, CoreConnect, or AMBA.

With reference to any one of the second aspect and the foregoing possible implementation manners, in a fourth possible implementation manner, the ASIC-based hard core is evenly distributed in the FPGA by using a crossbar switch matrix.

It can be seen from the foregoing embodiments that, in comparison with the prior art, the application has the following advantages:

ASIC-based hard cores are embedded in the FPGA provided by this application. The ASIC-based hard cores are evenly distributed in the FPGA, which can facilitate data exchange between each functional module and the ASIC-based hard core in proximity and reduce a time delay. The ASIC-based hard core includes a high-speed exchange and interconnection unit and at least one station, and the stations are evenly distributed. Therefore, a functional module can be conveniently connected to a station in proximity. A source functional module sends data to a station; the station sends the data to the high-speed exchange and interconnection unit; and the high-speed exchange and interconnection unit sends the data to a destination functional module by using a station connected to the destination functional module. In this way, data is transmitted between the source functional module and the destination functional module. The FPGA provided by the embodiments can implement fast transmission of data, and because the ASIC-based hard core has high performance, a requirement on a high-performance FPGA can be met.

BRIEF DESCRIPTION OF THE DRAWINGS

To describe the technical solutions in the embodiments of this application or in the prior art more clearly, the following briefly describes the accompanying drawings required for describing the embodiments or the prior art. Apparently, a person of ordinary skill in the art may still derive other drawings from these accompanying drawings without creative efforts.

DETAILED DESCRIPTION

The following clearly describes the technical solutions in the embodiments of the application with reference to the accompanying drawings in the embodiments of the application. Apparently, the described embodiments are merely some but not all of the embodiments of the application. All other embodiments obtained by a person of ordinary skill in the art based on the embodiments of the application without creative efforts shall fall within the protection scope of the application.

To make the objectives, features, and advantages of the application more apparent and understandable, the following describes specific implementation manners of the application in detail with reference to the accompanying drawings.

Embodiment 1

Figure 1:
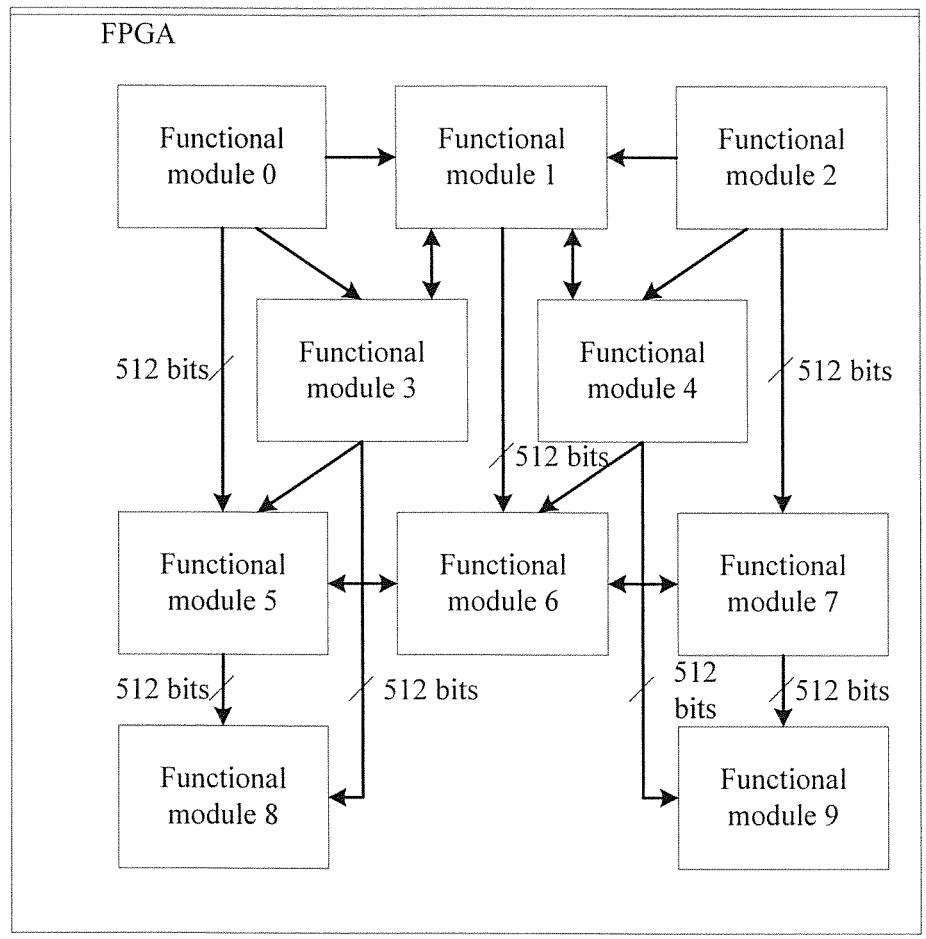
FIG. 1 is a schematic diagram of an application of an FPGA in the prior art.
Figure 2:
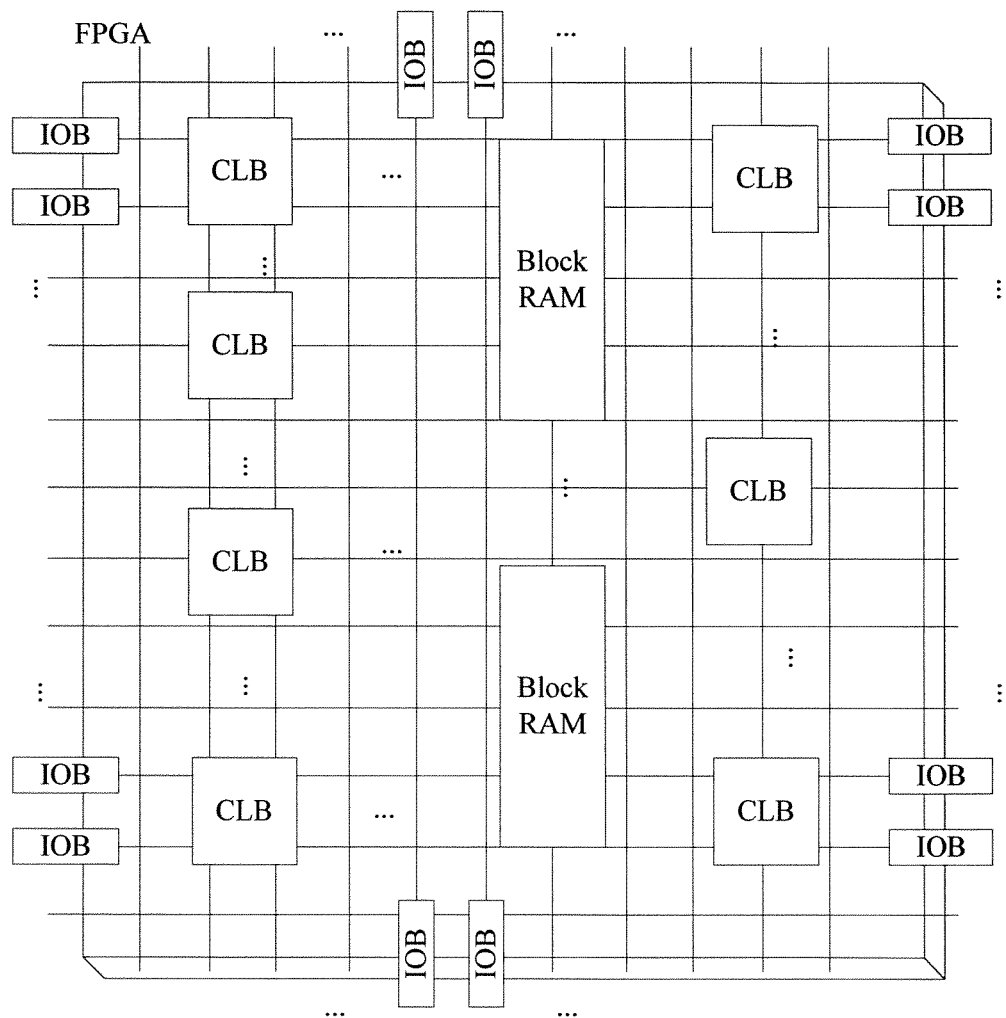
FIG. 2 is a diagram of an internal structure of an FPGA in the prior art.
Figure 3:
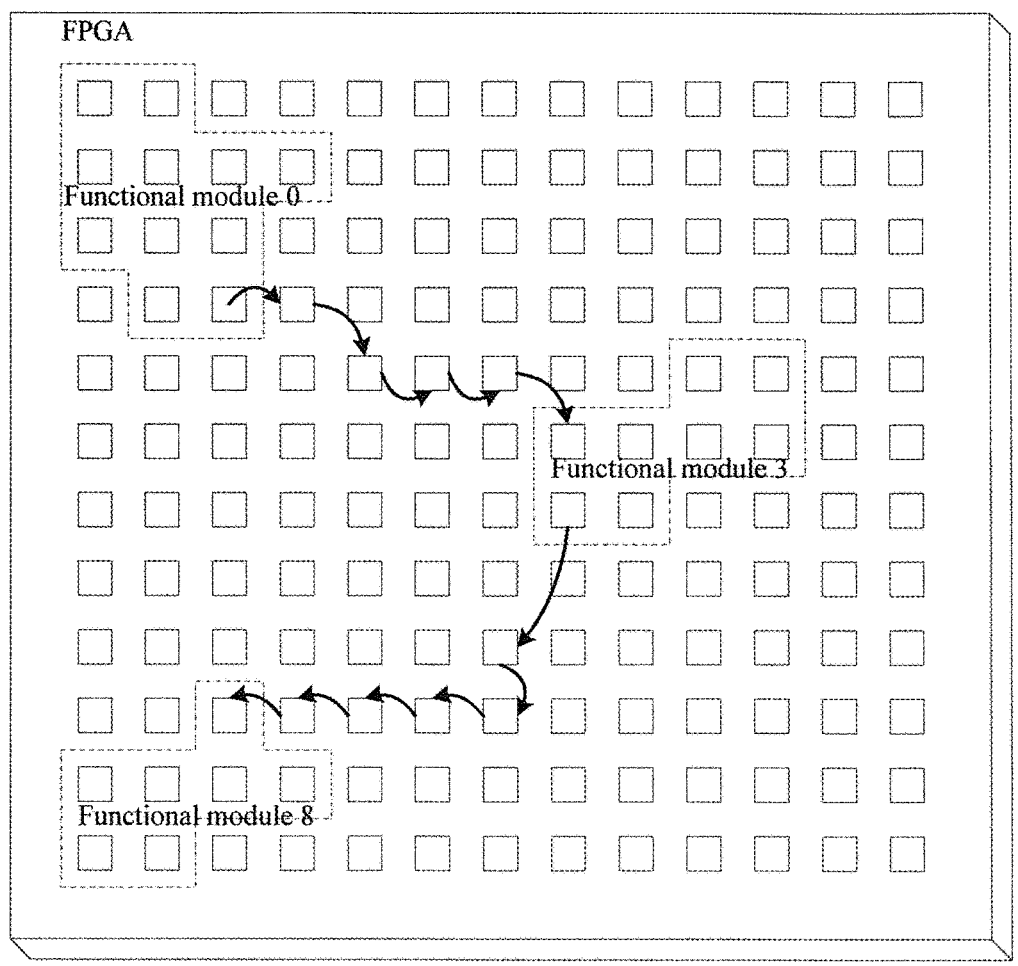
FIG. 3 is a schematic diagram of mappings of functional modules in an FPGA in the prior art.
Figure 4:
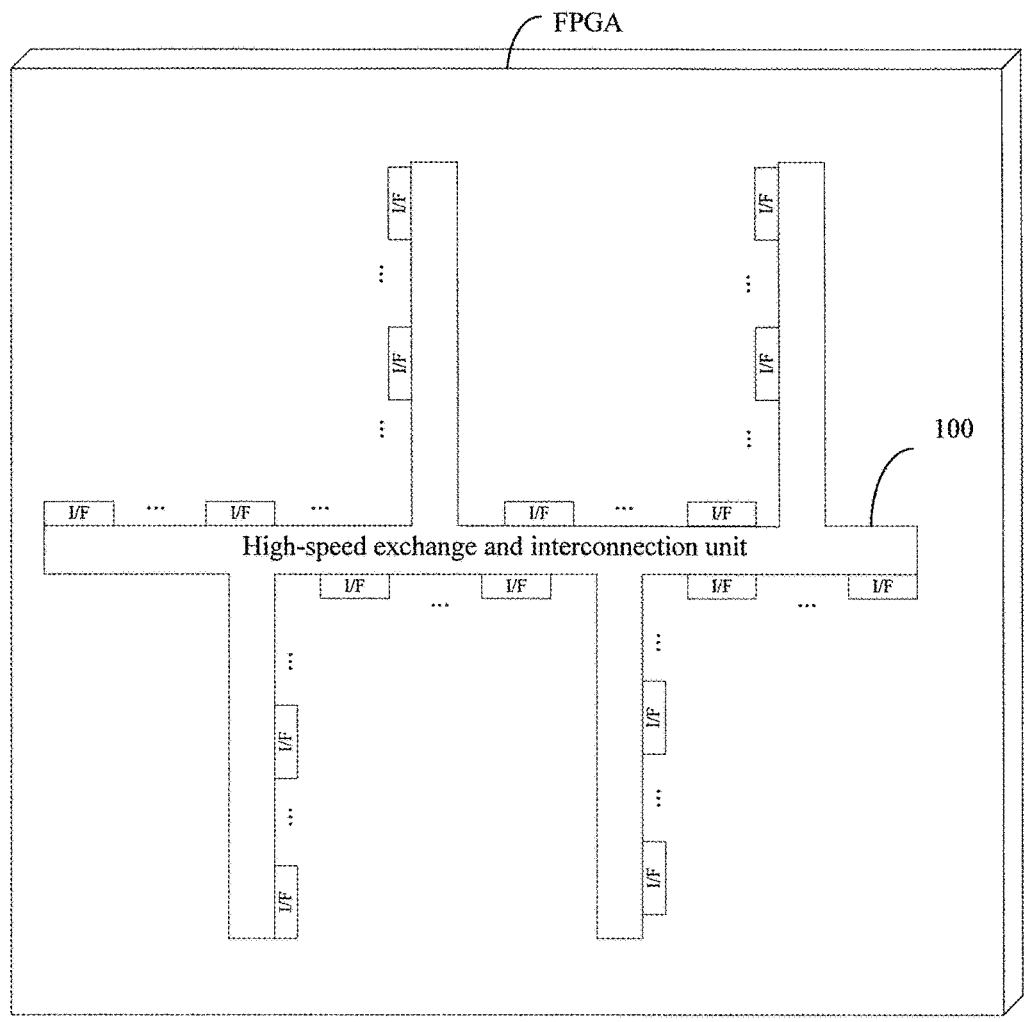
FIG. 4 is a schematic diagram of Embodiment 1 of an FPGA according to the application.

Referring to FIG. 4, FIG. 4 is a schematic diagram of Embodiment 1 of an FPGA according to the application.

An application specific integrated circuit ASIC-based hard core used for communication and interconnection is embedded in the FPGA provided by this embodiment.

Because the ASIC-based hard core can meet a requirement on high performance, and can run at a frequency higher than 1 GHz, the ASIC-based hard core is capable of providing a bandwidth of Tbps.

ASIC-based hard cores are evenly distributed in the FPGA. In this way, it may be ensured that each functional module in the FPGA can transmit data to an ASIC-based hard core in proximity, and a time delay can be reduced.

It should be noted that, a purpose of even distribution of the ASIC-based hard cores in the FPGA is to enable each functional module in the FPGA to connect to the ASIC-based hard core in proximity.

The ASIC-based hard core includes a high-speed exchange and interconnection unit 100 and at least one station I/F.

All stations I/F are evenly distributed. In this way, a station may be disposed around every functional module if possible, and each functional module may be connected to a station I/F that is spatially in proximity. Therefore, a data transmission time delay is reduced.

Each station I/F is connected to the high-speed exchange and interconnection unit 100.

The station I/F is configured to transmit data between each functional module in the FPGA and the ASIC-based hard core.

The high-speed exchange and interconnection unit 100 is configured to transmit data between all the stations.

It is understandable that, physically, each functional module in the FPGA is connected to a station I/F, but each station I/F is connected to the high-speed exchange and interconnection unit 100. Therefore, one functional module can send data to another functional module via a station I/F and the high-speed exchange and interconnection unit 100, and data transmission between the functional modules is implemented.

Because the ASIC-based hard core can meet a requirement on high performance, and can run at a frequency higher than 1 GHz, the ASIC-based hard core is capable of providing a bandwidth of Tbps.

ASIC-based hard cores are embedded in the FPGA provided by this embodiment. The ASIC-based hard cores are evenly distributed in the FPGA, which can facilitate data exchange between each functional module and the ASIC-based hard core in proximity and reduce a time delay. The ASIC-based hard core includes a high-speed exchange and interconnection unit and at least one station, and the stations are evenly distributed. Therefore, a functional module can be conveniently connected to a station in proximity. A source functional module sends data to a station; the station sends the data to the high-speed exchange and interconnection unit; and the high-speed exchange and interconnection unit sends the data to a destination functional module by using a station connected to the destination functional module. In this way, data is transmitted between the source functional module and the destination functional module. The FPGA provided by this embodiment can implement fast transmission of data, and because the ASIC-based hard core has high performance, a requirement on a high-performance FPGA can be met.

Embodiment 2

Figure 5:
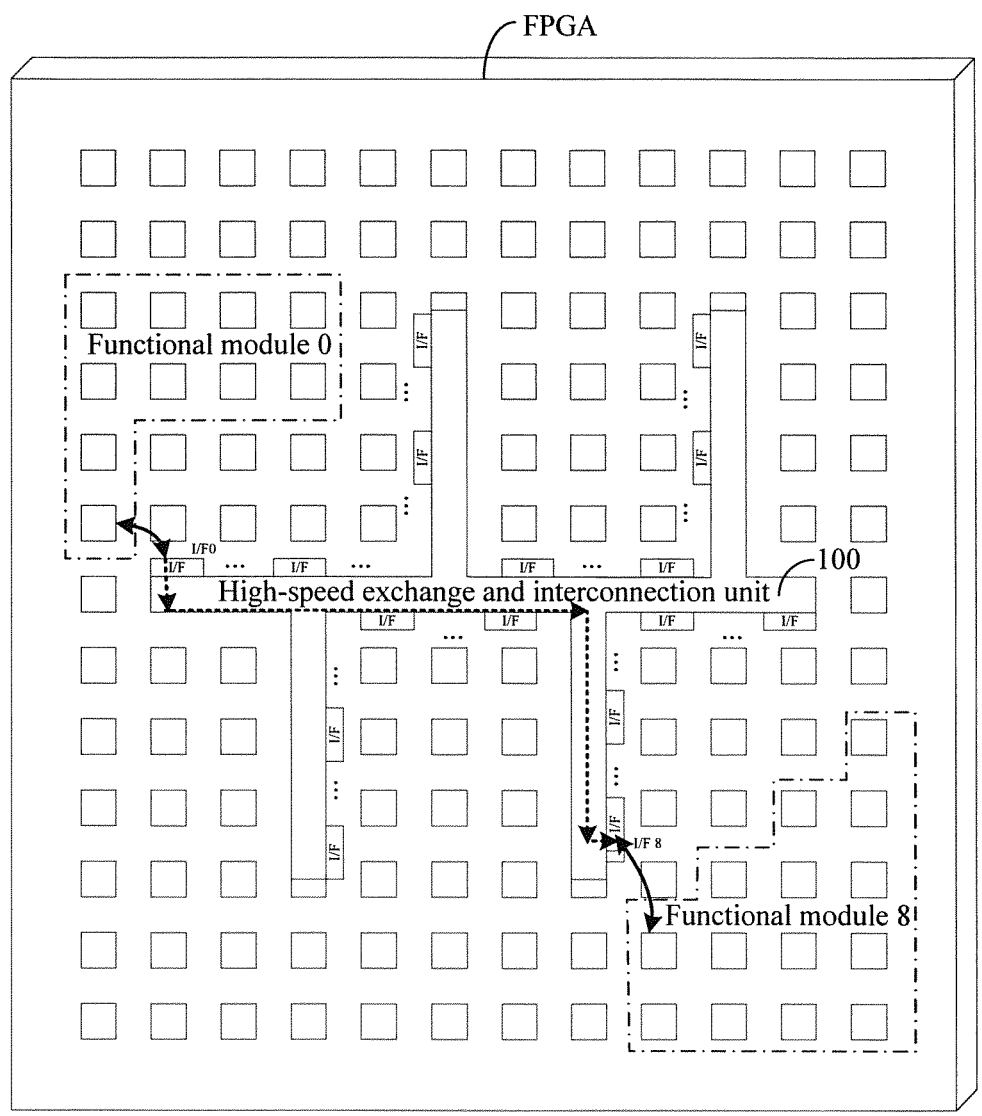
FIG. 5 is a schematic diagram of Embodiment 2 of an FPGA according to the application.

Referring to FIG. 5, FIG. 5 is a schematic diagram of Embodiment 2 of an FPGA according to the application.

The following uses data exchange between two functional modules as an example to describe in detail an operating process of an FPGA provided by the embodiment of the application.

A functional module 0 is located in an upper left corner of the FPGA, and a functional module 8 is located in a lower right corner of the FPGA. It can be seen from FIG. 5 that there is a long distance between the two functional modules. The functional module 0 is a source functional module, and the functional module 8 is a destination functional module, that is, the functional module 0 sends data to the functional module 8.

It is understandable that, the source functional module and the destination functional module are relative. The functional module 0 may also be used as a destination functional module, and the functional module 8 may also be used as a source functional module.

Both the functional module 0 and the functional module 8 include several CLBs in a dashed line box.

It should be noted that, a functional module may be connected to a station according to a proximity principle, that is, a functional module is preferentially connected to a station that is most spatially closest to the functional module in a spatial layout.

This embodiment is described by using an example in which one functional module is connected to one station, because this one-to-one setting is easy to implement, that is, a quantity of stations to be disposed depends on a quantity of functional modules. Each functional module is connected to a station that is spatially closest.

For example, the functional module 0 in FIG. 5 is connected to a station I/F0, and the functional module 8 is connected to a station I/F8.

First, the functional module 0 sends data to a high-speed exchange and interconnection unit 100 by using the station I/F0, and then the high-speed exchange and interconnection unit 100 sends the data to the functional module 8 by using the station I/F8.

It should be noted that, the data sent by the functional module 0 carries information about the functional module 8. Therefore, the high-speed exchange and interconnection unit 100 can determine, according to the information carried in the data, that the data needs to be sent to the station I/F8 that is connected to the functional module 8.

It is understandable that, the information carried in the data may be an ID of the functional module, or may be an address mapping. This is because a address segment belongs to a functional module.

As can be seen from FIG. 5, after the ASIC-based hard core is used in this embodiment, data can be transmitted between two functional modules through the ASIC-based hard core, without passing through any CLB. Because the high-speed exchange and interconnection unit 100 in the ASIC-based hard core has a high speed, a time delay can be reduced.

This embodiment is described by using an example in which one station corresponds to one functional module. It is understandable that, when the FPGA includes a large quantity of functional modules and a small quantity of stations, a correspondence between one station and multiple functional modules may be set. Such control is slightly more complex than that when one station corresponds to one functional module. However, resources can be fully used, and costs are reduced. Each station is connected to corresponding multiple functional modules according to a proximity principle.

An operating principle in which one station corresponds to multiple functional modules is the same as an operating principle in which one station corresponds to one functional module, and details are not described again herein.

In addition, this embodiment is described only by using two functional modules as an example. It is understandable that, the FPGA may include multiple functional modules and may be specifically set according to an actual requirement. In addition, division of functional modules may vary according to different specific circuits. The following describes two manners of division of functional modules.

Figure 6A:
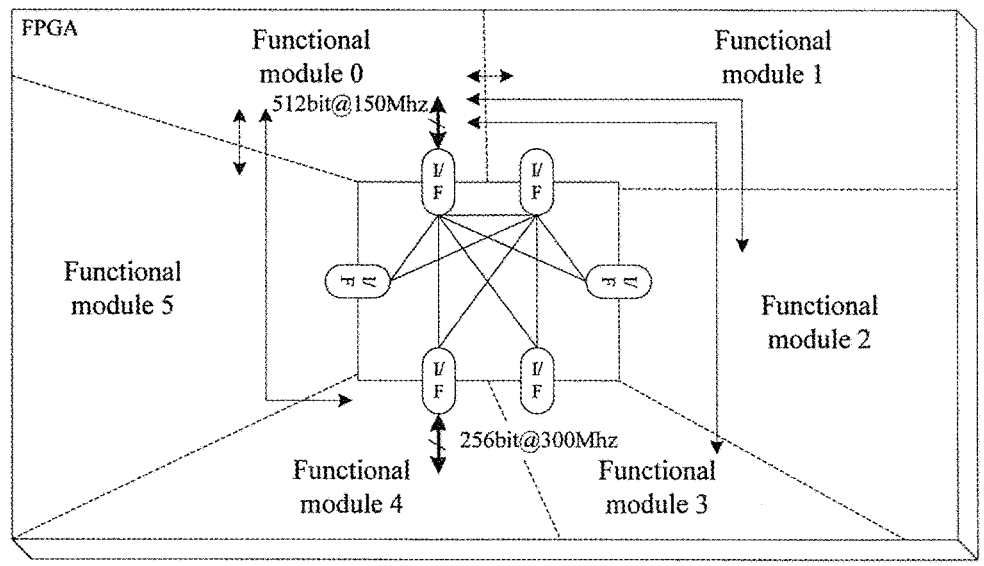
FIG. 6a is a schematic diagram of functional modules in an FPGA according to the application.

Referring to FIG. 6*a*, FIG. 6*a* is a schematic diagram of functional modules in an FPGA according to the application.

FIG. 6*a* includes six functional modules: a functional module 0 to a functional module 5.

Each functional module is connected to a high-speed exchange and interconnection unit 100 by using a station I/F.

It should be noted that, a clock frequency, a data bit width, and a time sequence that are consistent with those of a corresponding functional module are configured for each station.

For example, a transmission data bit width of the functional module 0 is 512 bits, and a clock frequency thereof is 150 MHz; therefore, data of the functional module 0 needs to be configured to 512 bits and 150 MHz. Transmission data of the functional module 4 is 256 bits and 300 MHz; therefore, data of the functional module 0 needs to be configured to 256 bits and 300 MHz. In this way, it may be ensured that smooth data transmission is performed between a functional module and a station.

It is understandable that, a same bit width and a same clock frequency may be configured for the stations in the FPGA, or different clock frequencies may be configured for the stations, depending on specific requirements of the functional modules.

Therefore, it can be seen that, for a station provided by the embodiment of the application, a clock frequency, a data bit width, and a time sequence may be set by programming. This may facilitate an application, and meet different requirements of different functional modules.

In addition, it should be noted that, some simple signals transmitted between the functional modules may also be exchanged by using a conventional manner in the prior art. For example, simple communication between the functional module 0 and the other five functional modules may still be communication implemented according to arrow lines shown in the figure.

Generally, the high-speed exchange and interconnection unit 100 is nonprogrammable, that is, parameters are set and configured. This makes performance of an ASIC-based hard core higher, improves universality of its application, and facilitates use.

Figure 6B:
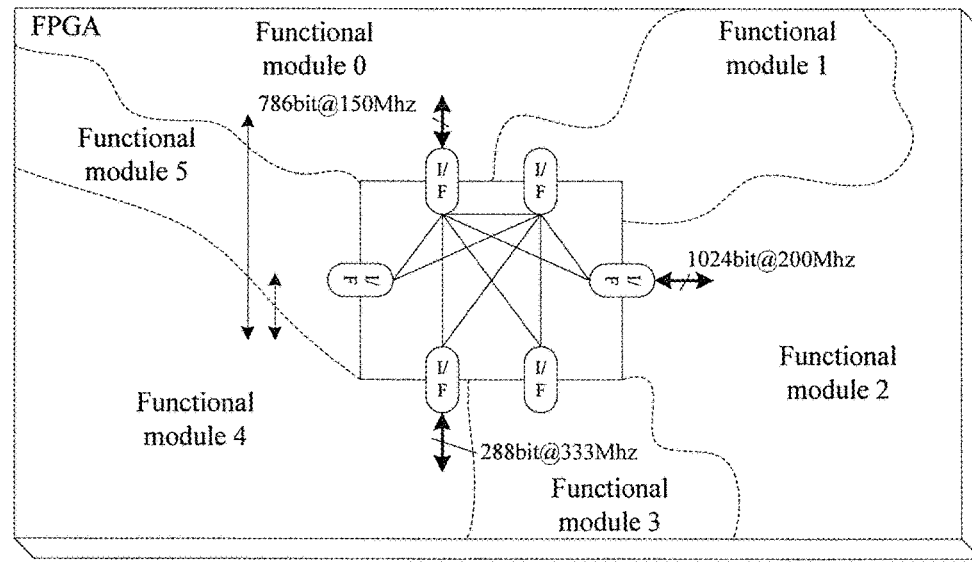
FIG. 6b is another schematic diagram of functional modules in an FPGA according to the application.

Because parts other than the ASIC-based hard core in the FPGA are programmable parts, division of functional modules may further be another form or combination, for example, may further be shown in FIG. 6b.

Referring to FIG. 6b, FIG. 6b is another schematic diagram of functional modules in an FPGA according to the application.

Division of functional modules in FIG. 6b is different from that in FIG. 6a.

A functional module 0 is configured to 786 bits and 150 MHz;
 a functional module 2 is configured to 1024 bits and 200 MHz; and
 a functional module 4 is configured to 288 bits and 333 MHz.

It should be noted that, the ASIC-based hard core provided by the embodiment of the application may use an on-chip interconnect bus protocol defined by an FPGA vendor, or may use a mature on-chip interconnect bus protocol that is commonly used in the art currently, including but not limited to AVALON, Wishbone, CoreConnect, AMBA, or the like.

It is understandable that, in one FPGA, only one on-chip interconnect bus protocol may be used, or multiple on-chip interconnect bus protocols may be used simultaneously. For example, in the FPGA, one I/F uses AVALON, and another I/F uses Wishbone.

Preferably, the high-speed exchange and interconnection unit provided by the embodiment of the application is evenly distributed in the FPGA by using a crossbar switch matrix (Cross Bar), or evenly distributed in the FPGA by using a ring bus (Ring Bus).

A crossbar switch matrix is shown in FIG. 4 and FIG. 5.

With reference to embodiments, the following describes specific implementation when a high-speed exchange and interconnection unit is evenly distributed by using a crossbar switch matrix, where the description is based on an assumption that an on-chip interconnect bus protocol used by an ASIC-based hard core is an AXI-Interconnection protocol.

Embodiment 3

Figure 7:
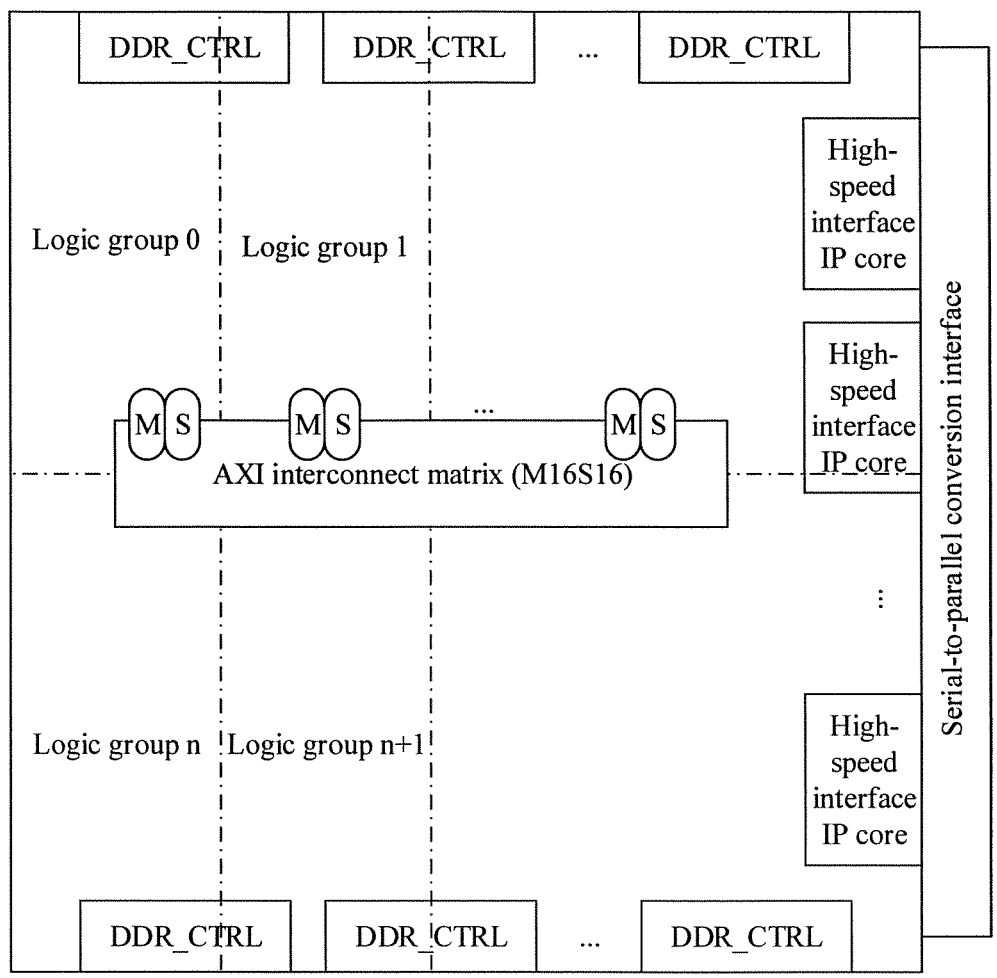
FIG. 7 is a schematic diagram of Embodiment 3 of an FPGA according to the application.

Referring to FIG. 7, FIG. 7 is a schematic diagram of Embodiment 3 of an FPGA according to the application.

In this embodiment, an ASIC-based hard core is a hard core using an AXI-Interconnection bus protocol, that is, the hard core uses an AXI interconnect matrix.

The AXI bus protocol belongs to a subset of AMBA.

In the FPGA, an AXI-Interconnection hard IP core is directly cured. This existing mature IP core in the art (currently, there are mainly two types of FPGAs, Xilinx and Altera, both of which have a corresponding soft core Soft Core, and the soft core needs to be cured only, and an I/F layout is properly made in positions on a silicon die die) has a low risk and high performance (a running frequency easily reaches a GHz magnitude), and basically without requiring any modification, can be interconnected with IP cores of most of current standards.

Each logic cell bank corresponds to at least one master station I/F and one slave station I/F. It should be noted that, one Master and one Slave are used as one station externally, that is, one station includes not only a Master, but also a Slave. In other words, a station can send data as an master, and can also receive data as a slave. In this way, it may be ensured that stations are evenly distributed in the FPGA if possible.

This embodiment is described by using an example in which each logic cell bank corresponds to one station, that is, each logic module is connected to one station. It is understandable that, one logic cell bank may also correspond to multiple stations.

A logic cell bank is a combination of some CLBs.

It is understandable that, an master station is a station that actively sends data, while a receiver station is a station that passively receives data.

An master in FIG. 7 is represented by M, and a slave in FIG. 7 is represented by S.

In this embodiment, 16 M's and 16 S's may be included.

It should be noted that, an M quantity may be different from an S quantity. Generally, the M quantity is smaller than the S quantity, because many functional modules need to passively receive data only, or passively wait for M to read data.

Certainly, for convenience, the M quantity may be set to be the same as the S quantity, that is, M and S appear in pairs. In addition, the specific M quantity and S quantity may be selected according to an actual requirement, and is not limited to 16 specified in this embodiment. The FPGA provided by this embodiment has a capability of allowing 16 Masters and 16 Slaves to perform data communication and exchange in parallel, and provides sufficient functional modules (sufficient bandwidth) for data communication and exchange.

DDR_CTRL in FIG. 7 is an interface between the FPGA and an external DDR chip. A high-speed interface IP core is also used to perform communication between the FPGA and an external chip. A serial-to-parallel conversion interface is also an interface for performing communication between the FPGA and the outside.

Embodiment 4

Figure 8A:
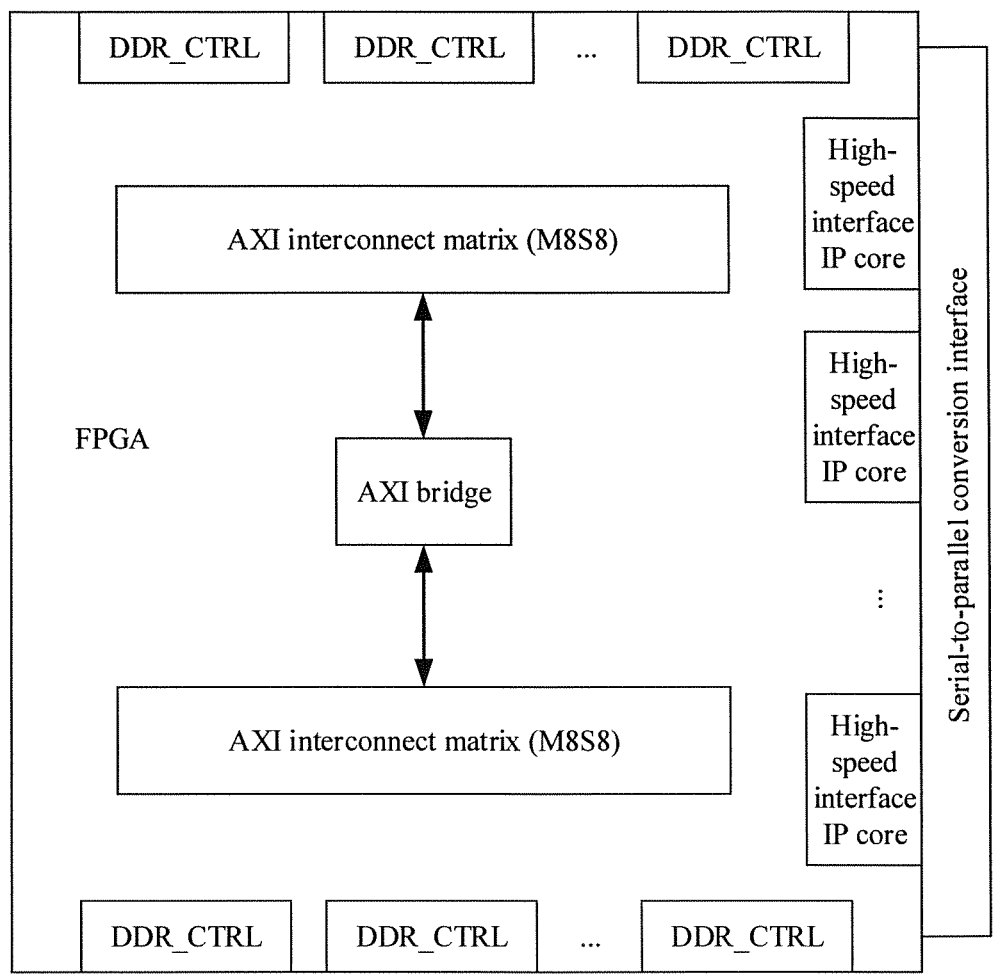
FIG. 8a is a schematic diagram of Embodiment 4 of an FPGA according to the application.

Referring to FIG. 8a, FIG. 8a is a schematic diagram of Embodiment 4 of an FPGA according to the application.

A difference between the FPGA provided by this embodiment and that in Embodiment 3 is: in Embodiment 3, only one AXI-Interconnection is used; in this embodiment, two AXI-Interconnections are used, and the AXI-Interconnections are interconnected by using an AXI bridge, so that communication and interconnection are implemented between hard cores.

As can be seen from FIG. 8a, the two AXI-Interconnections are both implemented by using AXI interconnect matrices, where either of the AXI interconnect matrices includes eight M's and eight S's. That is, an M quantity and an S quantity in the two AXI interconnect matrices are the same.

It is understandable that, the M quantity and the S quantity in the two AXI interconnect matrices may also be different. For example, the M quantity and the S quantity in one AXI interconnect matrix are 16, and the M quantity and the S quantity in the other AXI interconnect matrix are 8.

In comparison with the FPGA provided by Embodiment 3, the FPGA provided by this embodiment has the following advantages: There is low difficulty, both hardware difficulty and routing difficulty can be reduced, and costs can be reduced correspondingly.

In comparison with the FPGA provided by Embodiment 3, the FPGA provided by this embodiment has the following disadvantages: Simultaneous data transmission can be implemented between functional modules connected to stations within the two AXI interconnect matrices only; however, between the two AXI interconnect matrices, an AXI bridge needs to be used to transmit data between functional modules connected to stations, and this can be implemented by using time division multiplexing only. Therefore, in comparison with the FPGA provided by Embodiment 3, performance of this FPGA is reduced. For example, a bandwidth (or a throughput rate) for data transmission may be reduced. For example, if two functional modules need to implement data exchange in a same time period by using a bridge, the two functional modules can only share the bandwidth provided by this bridge.

Figure 8B:
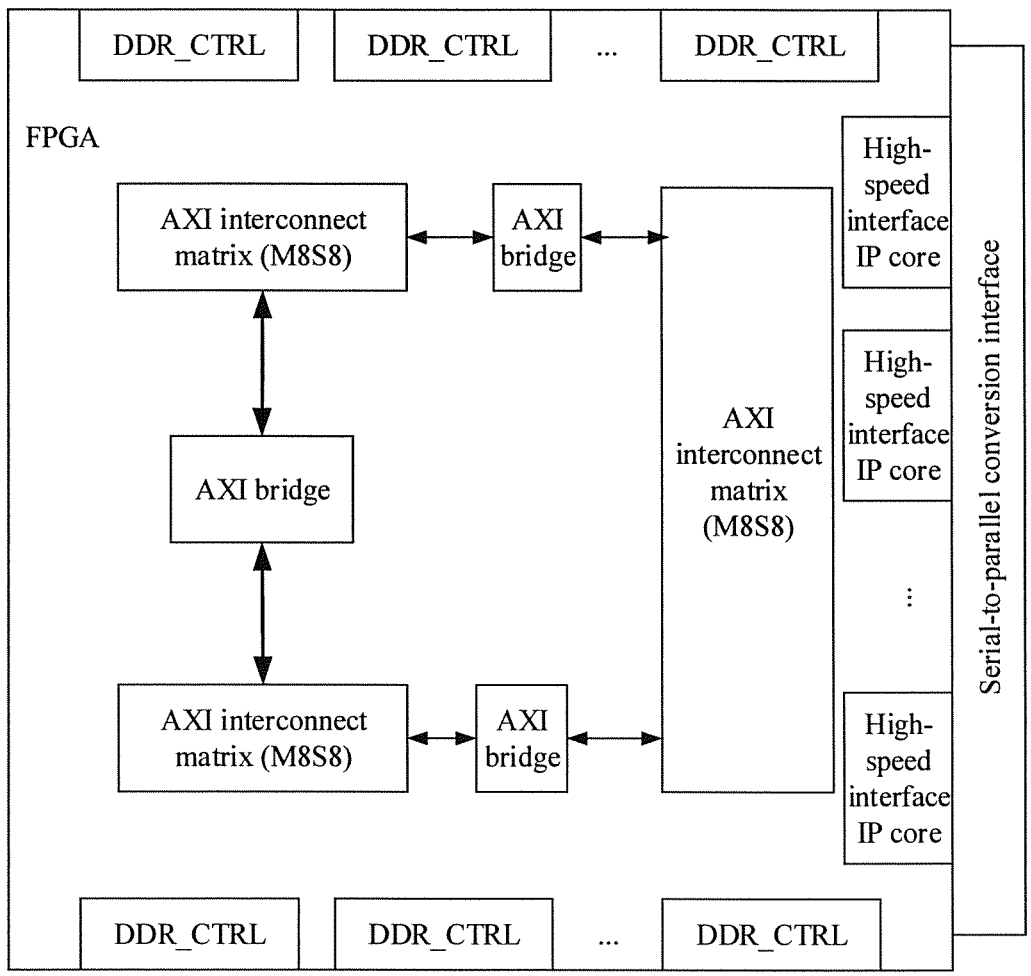
FIG. 8b is a schematic diagram of Embodiment 5 of an FPGA according to the application.

The FPGA in this embodiment is described by using two AXI interconnect matrices as an example. It is understandable that, three AXI interconnect matrices as shown in FIG. 8b may also be included, and the AXI interconnect matrices are interconnected by using an AXI bridge. Certainly, more AXI interconnect matrices may also be included, and the AXI interconnect matrices are interconnected by using an AXI bridge. An operating principle is the same as that in this embodiment, and is not described again herein.

In addition, the two AXI interconnect matrices in this embodiment have same performance. The following describes a case in which AXI interconnect matrices in an FPGA have different performance. A purpose of varying performance is to meet specific requirements. For example, in some application scenarios, only a few functional modules in an FPGA require high-performance data transmission, for example, require a higher bandwidth, and therefore, to reduce costs, one AXI interconnect matrix may be set to have high performance, so as to match these functional modules requiring high performance, but other ordinary functional modules may use an AXI interconnect matrix of ordinary performance for implementation.

With reference to an accompanying drawing, the following describes an FPGA in which AXI interconnect matrices have different performance.

Embodiment 6

Figure 9:
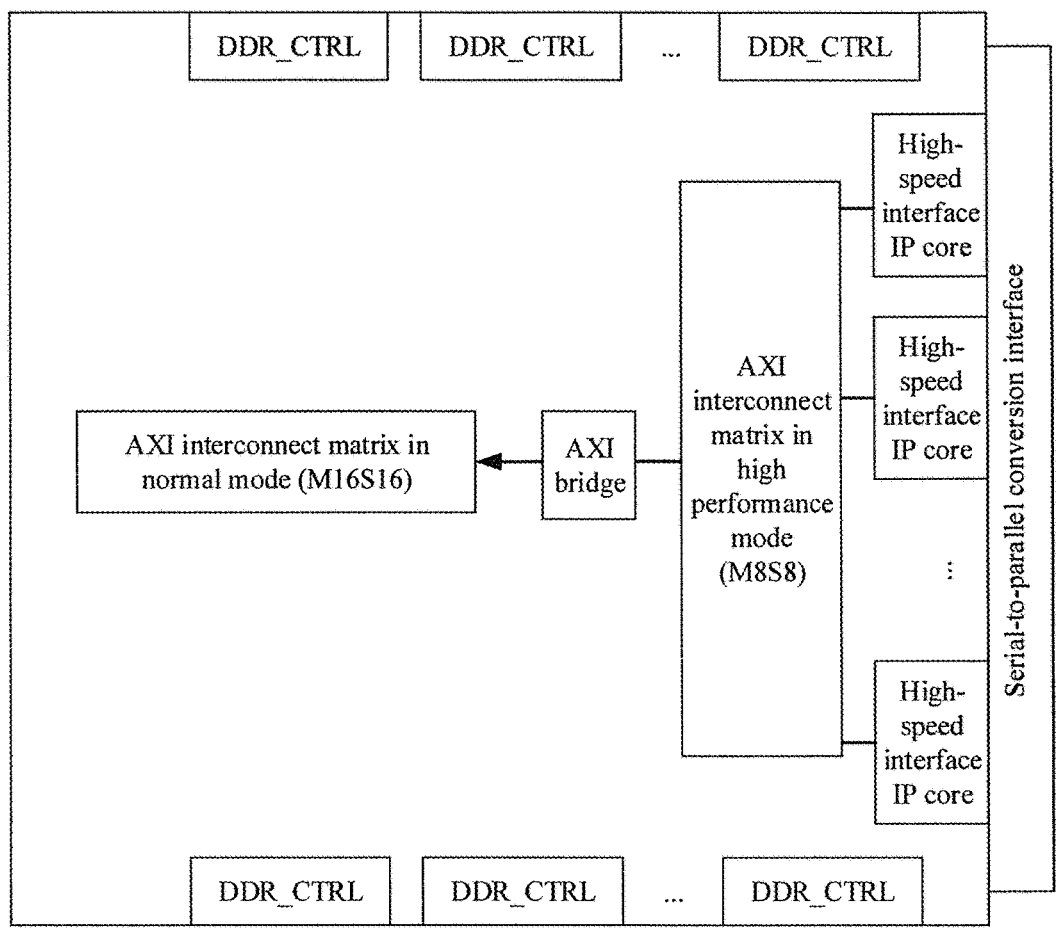
FIG. 9 is a schematic diagram of Embodiment 6 of an FPGA according to the application.

Referring to FIG. 9, FIG. 9 is a schematic diagram of Embodiment 6 of an FPGA according to the application.

The FPGA provided by this embodiment includes two AXI interconnect matrices, where one AXI interconnect matrix is an AXI interconnect matrix in normal mode, and one AXI interconnect matrix is an AXI interconnect matrix in high performance mode.

A bit width and a frequency of the AXI interconnect matrix in high performance mode are both higher than those of the AXI interconnect matrix in normal mode.

In this embodiment, the AXI interconnect matrix in normal mode includes 16 M's and 16 S's, and the AXI interconnect matrix in high performance mode includes 8 M's and 8 S's.

It is understandable that, specific M quantities and S quantities in the AXI interconnect matrix in normal mode and the AXI interconnect matrix in high performance mode may be selected according to an actual requirement, which is not specifically limited in the embodiment of the application and is described only as an example.

It should be noted that, this embodiment is described by using one AXI interconnect matrix in normal mode and one AXI interconnect matrix in high performance mode as an example. It is understandable that, multiple AXI interconnect matrices in high performance mode and/or multiple AXI interconnect matrices in normal mode may also be included. The AXI interconnect matrices are connected to each other by using an AXI bridge.

In all the foregoing embodiments, a high-speed exchange and interconnection unit in an FPGA is evenly distributed in the FPGA by using a crossbar switch matrix. The application further provides an FPGA in which a high-speed exchange and interconnection unit is evenly distributed by using a ring bus.

Embodiment 7

Figure 10:
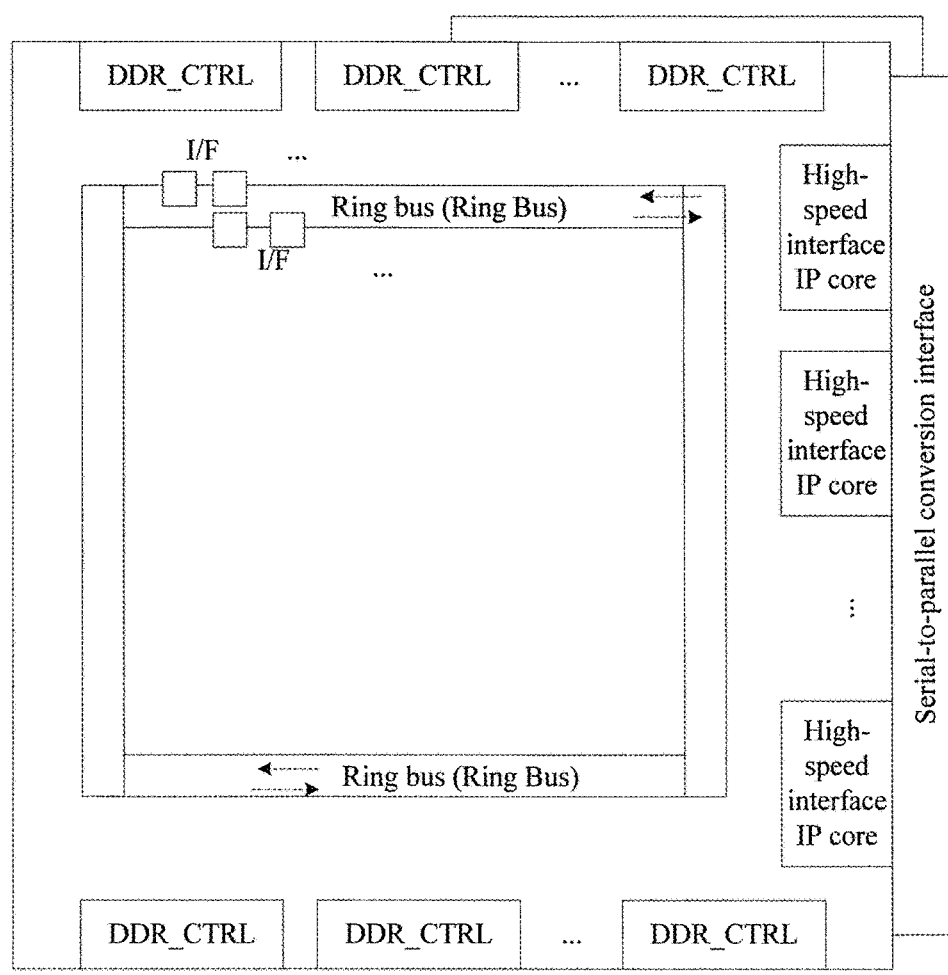
FIG. 10 is a schematic diagram of Embodiment 7 of an FPGA according to the application.

Referring to FIG. 10, FIG. 10 is a schematic diagram of Embodiment 7 of an FPGA according to the application.

In the FPGA provided by this embodiment, a high-speed exchange and interconnection unit is evenly distributed in the FPGA by using a ring bus.

Because the ring bus is a closed ring, the high-speed exchange and interconnection unit may be more evenly distributed in the FPGA, and stations on the ring bus may also be more evenly distributed. Therefore, it is more convenient for each functional module to connect to a station in proximity on the ring bus.

It should be noted that, in the FPGA shown in FIG. 10, M and S may also be set to appear in pairs on the ring bus. In this way, convenience of use may be improved, and manufacturing is also simpler. Certainly, an M quantity and an S quantity may also be set to be different. For example, the M quantity is set to be larger than the M quantity. This may be selected according to an actual requirement.

In a ring bus architecture, the stations can transmit data to a destination stage by stage, and bidirectional and parallel transmission can be performed. An advantage of bidirectional transmission is that a time delay can be reduced. For example, if only clockwise data transmission is provided, communication to be performed by a functional module with a previous node needs to traverse an entire circle on the chip. However, if bidirectional transmission is used, the transmission involves only one node anticlockwise.

An advantage of parallel transmission is: bidirectional and parallel transmission is equivalent to two data transmission paths, and the two paths may provide a certain bandwidth, so that the bandwidth is doubled.

Functions of DDR_CTRL, a high-speed interface IP core, and a serial-to-parallel conversion interface in the FPGA in FIG. 10 are the same as those in the embodiment corresponding to FIG. 7, and are not described again herein.

In summary, in the FPGA provided by each of the foregoing embodiments, an ASIC-based hard core is embedded in the FPGA, so that each functional module can perform proximity-based access. Therefore, a data transmission time delay can be reduced effectively, and overall performance of the FPGA is improved.

Based on an FPGA provided by the foregoing embodiment, an embodiment of the application further provides a data transmission method based on the FPGA provided by the foregoing embodiment. A detailed description is hereinafter provided with reference to an accompanying drawing.

Method Embodiment 1

Figure 11:
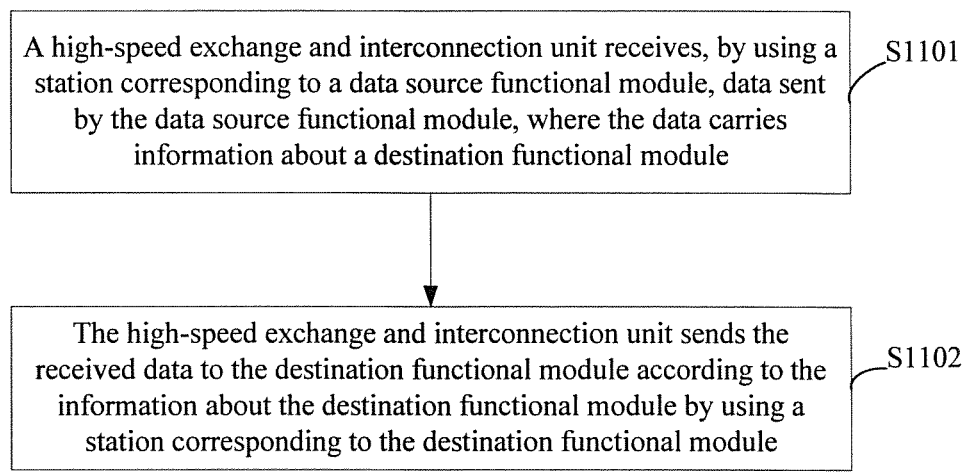
FIG. 11 is a schematic diagram of Embodiment 1 of an FPGA-based data communication method according to the application.

Referring to FIG. 11, FIG. 11 is a schematic diagram of Embodiment 1 of an FPGA-based data communication method according to the application.

The FPGA-based data communication method provided by this embodiment includes the following steps.

S1101. A high-speed exchange and interconnection unit receives, by using a station corresponding to a data source functional module, data sent by the data source functional module, where the data carries information about a destination functional module.

It should be noted that, the data source functional module is a party that sends data, and the destination functional module is a party that receives the data. It is understandable that, each functional module may be used as a data source functional module, or may be used as a destination functional module.

Because the data sent by the data source functional module carries the information about the destination functional module, the high-speed exchange and interconnection unit may find, according to the information, a station corresponding to the destination functional module, and the data can be forwarded to the destination functional module by the station corresponding to the destination functional module.

It should be noted that, after a used on-chip interconnect bus protocol is determined, content of the information about the destination functional module is determined, because the content of the information is specified by the on-chip interconnect bus protocol. The information about the destination functional module in the embodiment of the application may be an ID of the functional module, or may be an address mapping. Because a certain address segment belongs to a certain functional module, a functional module corresponding to an address may be found according to the address.

S1102. The high-speed exchange and interconnection unit sends the received data to the destination functional module according to the information about the destination functional module by using a station corresponding to the destination functional module.

In the method provided by this embodiment, an ASIC-based hard core is embedded in an FPGA, and the ASIC-based hard core includes a high-speed exchange and interconnection unit and at least one station. A data source functional module can send data to a destination functional module by using the high-speed exchange and interconnection unit. Because the data sent by the data source functional module carries information about the destination functional module, the high-speed exchange and interconnection unit can determine, according to the information, a corresponding station connected to the destination functional module. Because each functional module is connected to a station in proximity, this method can effectively reduce a data transmission time delay, and improve overall performance of the FPGA.

Method Embodiment 2

Figure 12:
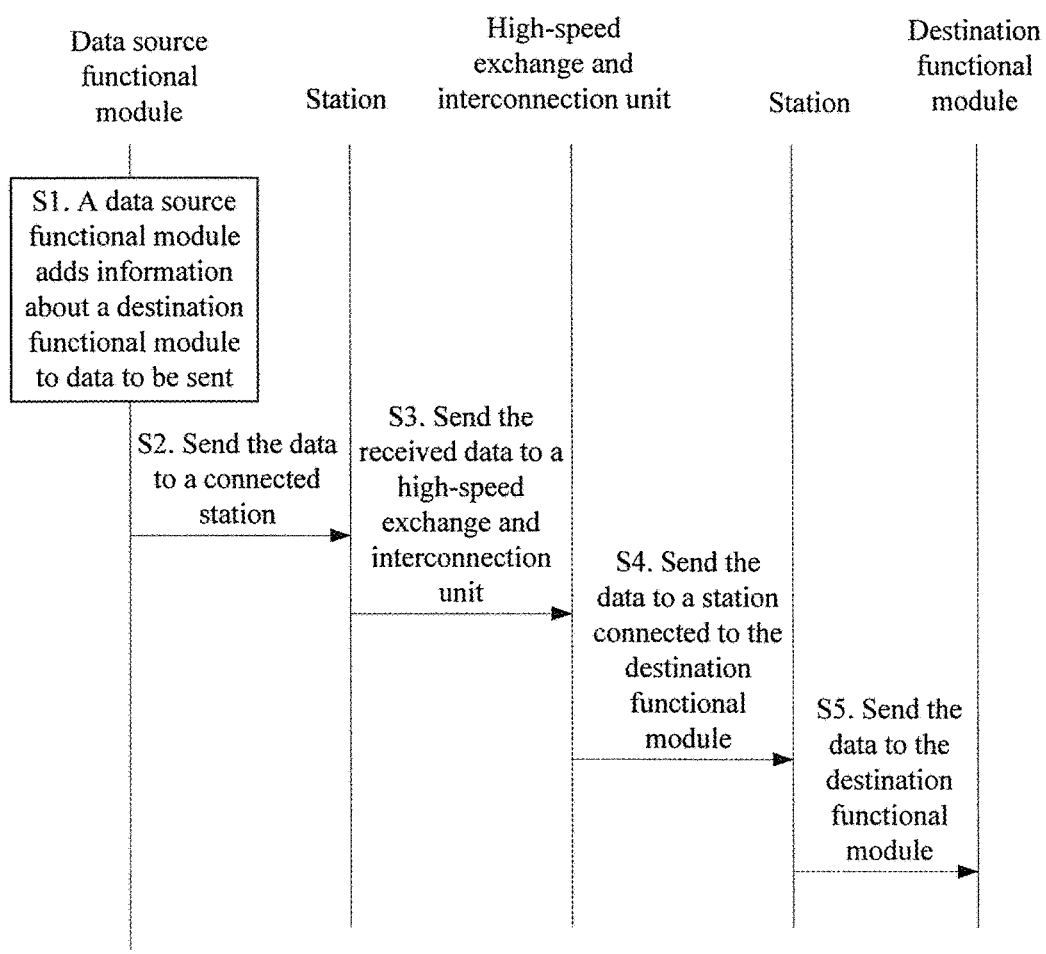
FIG. 12 is a signaling diagram of an FPGA-based data communication method according to the application.

Referring to FIG. 12, FIG. 12 is a signaling diagram of an FPGA-based data communication method according to the application.

A quantity of stations is equal to a quantity of functional modules, and one of the stations is connected to one of the functional modules; or each station corresponds to multiple functional modules, and each station is connected to the corresponding multiple functional modules.

This embodiment is described by using an example in which one station corresponds to one functional module. Such control is simple and easy to implement.

The following uses data transmission between two functional modules as an example for description, where the two modules are a data source functional module and a destination functional module.

S1. A data source functional module adds information about a destination functional module to data that needs to be sent.

S2. After the information is added, the data is sent to a station connected to the data source functional module.

S3. The station connected to the data source functional module sends the received data to a high-speed exchange and interconnection unit.

S4. The high-speed exchange and interconnection unit sends, according to the information, the data to a station connected to the destination functional module.

S5. The station connected to the destination functional module sends the data to the destination functional module.

In this embodiment, how to use the FPGA provided by the foregoing embodiment to transmit data is described in detail.

A quantity of the stations is equal to a quantity of functional modules, and one of the stations is connected to one of the functional modules; or each station corresponds to multiple functional modules, and each station is connected to the corresponding multiple functional modules.

When the quantity of the stations is equal to the quantity of the functional modules, a clock frequency, a data bit width, and a time sequence that are consistent with those of a corresponding functional module are configured for each station.

The high-speed exchange and interconnection unit is nonprogrammable.

An on-chip interconnect bus protocol of an ASIC-based hard core includes at least one of the following: AVALON, Wishbone, CoreConnect, or AMBA.

The ASIC-based hard core is evenly distributed in the FPGA by using a crossbar switch matrix.

The foregoing descriptions are merely preferable embodiments of this application, but are not intended to limit this application. Although the exemplary embodiments of this application are disclosed above, the embodiments are not intended to limit this application. By using the method and the technical content disclosed above, any persons of ordinary skill in the art can make a plurality of possible changes and modifications on the technical solutions of this application, or amend the technical solutions thereof to be embodiments with equal effects through equivalent variations without departing from the protection scope of the technical solutions of this application. Therefore, any simple amendments, equivalent variations, and modifications made on the above embodiments according to the technical essence of this application without departing from the content of the technical solutions of this application shall fall within the protection scope of the technical solutions of this application.

What is claimed is:

1. A field programmable gate array (FPGA), comprising:
a plurality of functional modules in the FPGA; and
an application specific integrated circuit based (ASIC-based) hard core embedded in the FPGA for communication between the plurality of functional modules intra-FPGA, wherein the ASIC-based hard core comprises:
a high-speed exchange and interconnection unit and at least one station; wherein
each station of the at least one station is connected to the high-speed exchange and interconnection unit, and each station of the at least one station is configured to transmit data from a respective functional module of the plurality of functional modules in the FPGA to the high-speed exchange and interconnection unit, and transmit data from the high-speed exchange and interconnection unit to the respective functional module; and the high-speed exchange and interconnection unit is configured to transmit data between the stations of the at least one station in the ASIC-based hard core.

2. The FPGA according to claim 1, wherein:

a quantity of stations of the at least one station is equal to a quantity of functional modules of the plurality of functional modules, and each one station of the at least one station is connected to a respective one of the functional modules of the plurality of functional modules; or each station of the at least one station corresponds to multiple functional modules of the plurality of functional modules, and each station of the at least one station is connected to the corresponding multiple functional modules of the plurality of functional modules.

3. The FPGA according to claim 2, wherein when the quantity of the stations of the at least one station is equal to the quantity of the functional modules of the plurality of functional modules, and each station of the at least one station corresponds to a functional module of the plurality of functional modules, for each station of the at least one station a clock frequency, a data bit width, and a time sequence that are consistent with those of a corresponding functional module are configured for the respective station.

4. The FPGA according to claim 1, wherein an on-chip interconnect bus protocol of the ASIC-based hard core comprises at least one of the following: AVALON, Wishbone, CoreConnect, or AMBA.

5. The FPGA according to claim 1, wherein the ASIC-based hard core is one of multiple ASIC-based hard cores which are evenly distributed in the FPGA by using a crossbar switch matrix.

6. The FPGA according to claim 4, wherein the ASIC-based hard core is a hard core using an AXI-Interconnection bus protocol, wherein the AXI bus protocol belongs to the AMBA.

7. The FPGA according to claim 6, wherein the FPGA comprises at least one logic cell bank, and wherein each logic cell bank of the at least one logic cell bank comprises at least one master station and at least one slave station.

8. The FPGA according to claim 5, wherein the ASIC-based hard core comprises two or more hard cores using an AXI-Interconnection bus protocol, and wherein the two or more hard cores using the AXI-Interconnection bus protocol communicate with each other by using an AXI bridge.

9. The FPGA according to claim 8, wherein the two or more hard cores using the AXI-Interconnection bus protocol comprise a same quantity of master stations and a same quantity of slave stations, and have a same bit width and a same clock frequency.

10. The FPGA according to claim 8, wherein the two or more hard cores using the AXI-Interconnection bus protocol comprise different quantities of master stations and different quantities of slave stations, and have different bit widths and different clock frequencies.

11. The FPGA according to claim 8, wherein some hard cores of the two or more hard cores using the AXI-Interconnection bus protocol comprise a same quantity of master stations and a same quantity of slave stations, and have a same bit width and a same clock frequency; and other hard cores of the two or more hard cores using the AXI-Interconnection bus protocol comprise different quantities of master stations and different quantities of slave stations, and have different bit widths and different clock frequencies.

12. The FPGA according to claim 1, wherein the ASIC-based hard core is one of multiple ASIC-based hard cores which are evenly distributed in the FPGA by using a ring bus.

13. A method for data communication based on a field programmable gate array (FPGA), wherein the FPGA comprises a plurality of functional modules, and an application specific integrated circuit based (ASIC-based) hard core used for communication and interconnection between the plurality of functional modules intra-FPGA is embedded in the FPGA; wherein the ASIC-based hard core comprises a high-speed exchange and interconnection unit and at least one station; wherein each station of the at least one station is connected to the high-speed exchange and interconnection unit, and each station of the at least one station is configured to transmit data between a respective functional module in the FPGA and the high-speed exchange and interconnection unit; wherein the high-speed exchange and interconnection unit is configured to transmit data between the stations of the at least one station in the ASIC-based hard core; and wherein the method comprises:

receiving, by the high-speed exchange and interconnection unit from a first station of the at least one station that corresponds to a source functional module of the plurality of functional modules, data sent by the source functional module, wherein the data carries information about a destination functional module of the plurality of functional modules;

sending, by the high-speed exchange and interconnection unit, the received data to a second station of the at least one station that corresponds to the destination functional module according to the information about the destination functional module; and transmitting, by the second station corresponding to the destination functional module, the received data to the destination functional module.

14. The method according to claim 13, wherein:

a quantity of stations of the at least one station is equal to a quantity of functional modules of the plurality of functional modules, and each one station of the at least one station is connected to a respective one of the functional modules of the plurality of functional modules; or each station of the at least one station corresponds to multiple functional modules of the plurality of functional modules, and each station of the at least one station is connected to the corresponding multiple functional modules.

15. The method according to claim 14, wherein when the quantity of the stations of the at least one station is equal to the quantity of the functional modules of the plurality of functional modules, and each station of the at least one station corresponds to a functional module of the plurality of functional modules, for each station of the at least one station a clock frequency, a data bit width, and a time sequence that are consistent with those of a corresponding functional module are configured for the respective station.

16. The method according to claim 13, wherein an on-chip interconnect bus protocol of the ASIC-based hard core comprises at least one of the following: AVALON, Wishbone, CoreConnect, or AMBA.

17. The method according to claim 13, wherein the ASIC-based hard core is one of multiple ASIC-based hard cores which are evenly distributed in the FPGA by using a crossbar switch matrix.

\* \* \* \* \*